United States Patent
Jang et al.

(10) Patent No.: US 9,148,043 B2
(45) Date of Patent: Sep. 29, 2015

(54) HALL SENSOR COVER AND MOTOR USING THE SAME

(71) Applicant: NEW MOTECH CO., LTD., Gwangju (KR)

(72) Inventors: Jeong Cheol Jang, Gwangju (KR); Gyeong Sik Yang, Gwangju (KR)

(73) Assignee: NEW MOTECH CO., LTD., Gwangju (KR)

( * ) Notice: Subject to any disclaimer, the term of this patent is extended or adjusted under 35 U.S.C. 154(b) by 0 days.

(21) Appl. No.: 14/382,338

(22) PCT Filed: Jan. 25, 2013

(86) PCT No.: PCT/KR2013/000611
§ 371 (c)(1),
(2) Date: Sep. 4, 2014

(87) PCT Pub. No.: WO2013/151231
PCT Pub. Date: Oct. 10, 2013

(65) Prior Publication Data
US 2015/0130328 A1    May 14, 2015

(30) Foreign Application Priority Data
Apr. 3, 2012  (KR) .................. 10-2012-0034177

(51) Int. Cl.
| H02K 11/00 | (2006.01) |
| --- | --- |
| G01P 1/02 | (2006.01) |
| G01D 5/14 | (2006.01) |
| G01D 11/24 | (2006.01) |
| G01R 15/20 | (2006.01) |
| G01R 33/00 | (2006.01) |
| G01R 33/07 | (2006.01) |

(52) U.S. Cl.
CPC ............ *H02K 11/0021* (2013.01); *G01D 5/145* (2013.01); *G01D 11/245* (2013.01); *G01P 1/026* (2013.01); *G01R 15/202* (2013.01); *G01R 33/0047* (2013.01); *G01R 33/072* (2013.01)

(58) Field of Classification Search
CPC .......................... H02K 29/08; H02K 11/0021
IPC ...................................... H02K 29/08, 11/0021
See application file for complete search history.

(56) References Cited

U.S. PATENT DOCUMENTS

| 5,233,295 | A | * | 8/1993 | Murata et al. .............. 324/207.2 |
| --- | --- | --- | --- | --- |
| 6,191,506 | B1 | * | 2/2001 | Wright ............................ 29/598 |
| 7,332,840 | B2 | * | 2/2008 | Ku et al. ..................... 310/68 R |
| 2009/0189475 | A1 | * | 7/2009 | Shin ............................. 310/195 |

(Continued)

FOREIGN PATENT DOCUMENTS

| KR | 10-2011-0056702 A | 5/2011 |
| --- | --- | --- |
| KR | 10-1103989 B1 | 1/2012 |

(Continued)

*Primary Examiner* — Dang Le
(74) *Attorney, Agent, or Firm* — Revolution IP, PLLC

(57) ABSTRACT

Disclosed is a hall sensor cover including: mag-mate terminal portions each having a mag-mate terminal having a coil insertion slit formed thereon and a power terminal pin extended toward one side direction of the mag-mate terminal; and a power connector portion having a base having mag-mate terminal insertion slots formed to insert the mag-mate terminal portions thereinto and power terminal insertion portions each adapted to insert the power terminal pin thereinto, wherein the power connector portion is coupled to the end portions of teeth of an insulator.

8 Claims, 5 Drawing Sheets

(56) References Cited

U.S. PATENT DOCUMENTS

2011/0316365 A1   12/2011   Kim
2012/0175993 A1    7/2012   Jang et al.

FOREIGN PATENT DOCUMENTS

KR   10-1130978 B1      3/2012
WO   WO 2011-139017 A1  11/2011

* cited by examiner

HALL SENSOR COVER AND MOTOR USING THE SAME

CROSS REFERENCE TO PRIOR APPLICATIONS

This application is a National Stage Application of PCT International Patent Application No. PCT/KR2013/000611 filed on Jan. 25, 2013, under 35 U.S.C. §371, which claims priority to Korean Patent Application No. 10-2012-0034177 filed on Apr. 3, 2012, which are all hereby incorporated by reference in their entirety.

TECHNICAL FIELD

The present invention relates to a motor, and more particularly, to a motor having a new power connection structure in which a hall sensor cover is coupled in an easier manner to allow coils wound on a stator of the motor to be easily connected to connectors from which external power is applied, thereby providing simple manufacturing processes and low manufacturing costs.

BACKGROUND ART

In general, a motor consists of a stator and a rotor, and the motor used for electric machinery such as a drum type washing machine and the like is configured to have an insulator adapted to surround a stator core in such a manner as to allow coils to be wound thereon. The coils are electrically connected to a hall sensor cover and a printed circuit board to perform the application of power.

FIG. 1 shows the state where the hall sensor cover is coupled to the insulator of the stator core in the conventional practice. As shown in FIG. 1, an insulator 1 is made of an electrical insulation resin and coupled to the top portion of a stator core (not shown). The insulator 1 has teeth 11 extended outwardly therefrom in a radial direction. The insulator 1 also has an inner peripheral portion 10 formed at the inside of the teeth 11, and mag-mate terminal portions 13 are formed on the inner peripheral portion 10 to conduct the connection with external power connectors. A plurality of mag-mate terminals 14 is inserted into the mag-mate terminal portions 13 to conduct the electrical connection with the coils. In FIG. 1, three mag-mate terminals 14 are provided to conduct the power connection of the phases U, V, W.

So as to connect the external power to the mag-mate terminal portions 13, a hall sensor cover 100 has mag-mate terminal insertion portions 101 formed at the corresponding positions to the mag-mate terminal portions 13. The mag-mate terminal insertion portions 101 have pins (not shown) formed at the inside thereof in such a manner as to be connected to the mag-mate terminals 14, and the pins are electrically connected to power terminal pins 104 by means of lead wires 103. The power terminal pins 104 are located at the inside of power terminal insertion portions 102, and the external power connectors are coupled to the power terminal insertion portions 102 to conduct the electrical connection thereto. Further, the hall sensor cover 100 has a printed circuit board (not shown) mounted in the interior of one side thereof, and the printed circuit board is protected by means of a silicone cover 105.

Like this, the hall sensor cover 100 serves to supply the external power to the coils wound on the insulator and to measure the size or polarity of a magnetic field to transmit the measured signal to a control unit of a device using the motor.

According to the external power connection using the conventional hall sensor cover 100, the mag-mate terminal portions 13 of the insulator 1 and the power terminal insertion portions 102 of the hall sensor cover 100 are located on the inner peripheral portion 10 of the insulator 1, so that the lead wires 103 should be introduced into the hall sensor cover 100 to conduct the external power connection. Therefore, the manufacturing process of the hall sensor cover 100 becomes complicated, and the size of the hall sensor cover 100 has to be longer than the length of each tooth 11, which makes the quantity of plastic molding resin consumed undesirably increased. Moreover, the printed circuit board is fixed by means of the silicone cover 105, which needs the time for curing the silicone during the manufacturing process, thereby undesirably increasing the manufacturing time and process.

So as to solve the above-mentioned conventional problems, thus, the inventors propose to a hall sensor cover having a new structure in which the external power connection through the mag-mate terminals is conducted not on the inner peripheral portion of the insulator, but on the outer peripheral portion of the insulator, and to a motor using the same.

DISCLOSURE OF INVENTION

Technical Problem

Accordingly, the present invention has been made in view of the above-mentioned problems occurring in the prior art, and it is an object of the present invention to provide a hall sensor cover having a new configuration, thereby providing a motor having simple manufacturing processes and low manufacturing costs.

The above object and other objects of the present invention will be easily achieved by a preferred embodiment of the present invention as will be described below.

Solution to Problem

To accomplish the above object, according to an aspect of the present invention, there is provided a hall sensor cover including: mag-mate terminal portions each having a mag-mate terminal having a coil insertion slit formed thereon and a power terminal pin extended toward one side direction of the mag-mate terminal; and a power connector portion having a base having mag-mate terminal insertion slots formed to insert the mag-mate terminal portions thereinto and power terminal insertion portions each adapted to insert the power terminal pin thereinto, wherein the power connector portion is coupled to the end portions of teeth of an insulator.

According to the present invention, desirably, the hall sensor cover further includes a hall sensor portion having a hall sensor body coupled to one side of the power connector portion, a printed circuit board located inside the hall sensor body, and a printed circuit board cover coupled to the top portion of the hall sensor body, the hall sensor body being coupled to the end portions of the teeth of the insulator.

According to the present invention, desirably, the printed circuit board cover includes at least one or more fixing protrusions formed on the inside thereof.

According to the present invention, desirably, the hall sensor cover further includes coil introduction portions extended to the rear surfaces of the mag-mate terminal insertion slots in such a manner as to allow coils to be introduced into the coil insertion slits of the mag-mate terminals.

To accomplish the above object, according to another aspect of the present invention, there is provided a motor including: a stator core; an insulator adapted to surround the stator core and having teeth protruded radially therefrom; and a hall sensor cover coupled to the end portions of the teeth of the insulator.

Advantageous Effects of Invention

According to the present invention, there is provided the hall sensor cover having a new configuration to provide a motor having simple manufacturing processes and low manufacturing costs.

MODE FOR THE INVENTION

Hereinafter, an explanation on a hall sensor cover and a motor using the same according to the present invention will be in detail given with reference to the attached drawings.

Figure 1:
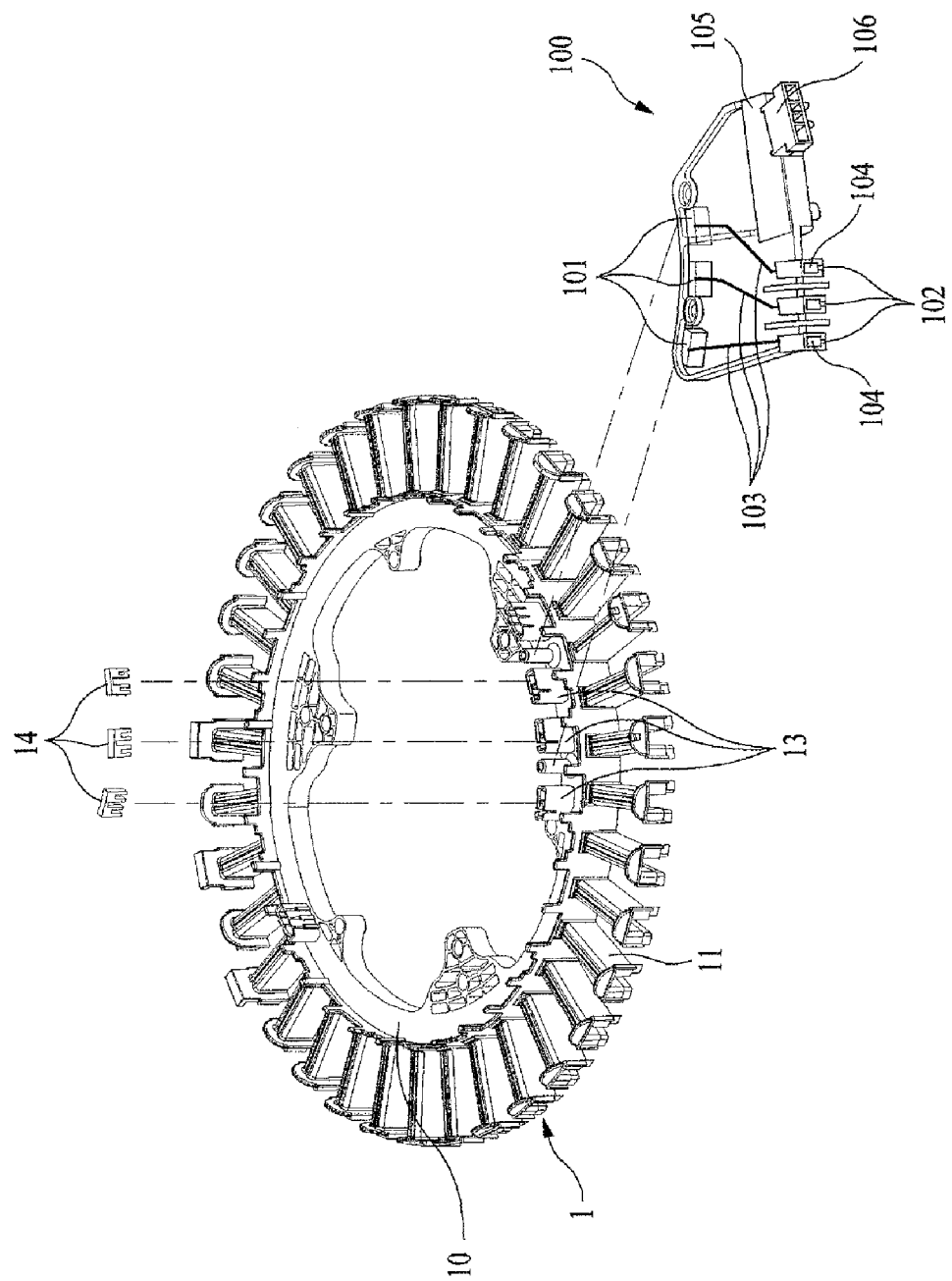
FIG. 1 is a perspective view showing a hall sensor cover and an insulator of a motor in the conventional practice.
Figure 2:
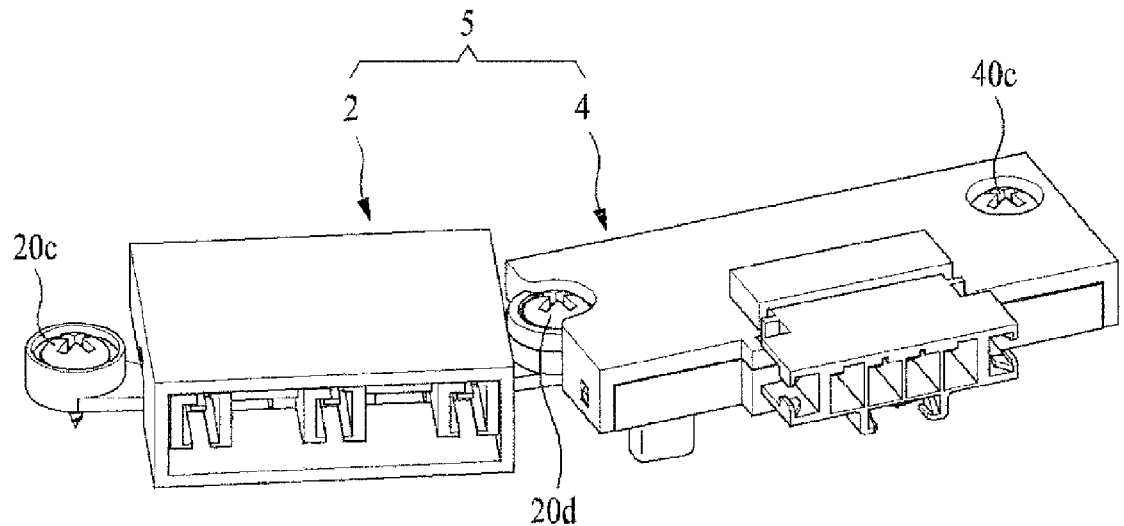
FIG. 2 is a perspective view showing a hall sensor cover according to the present invention.
Figure 3:
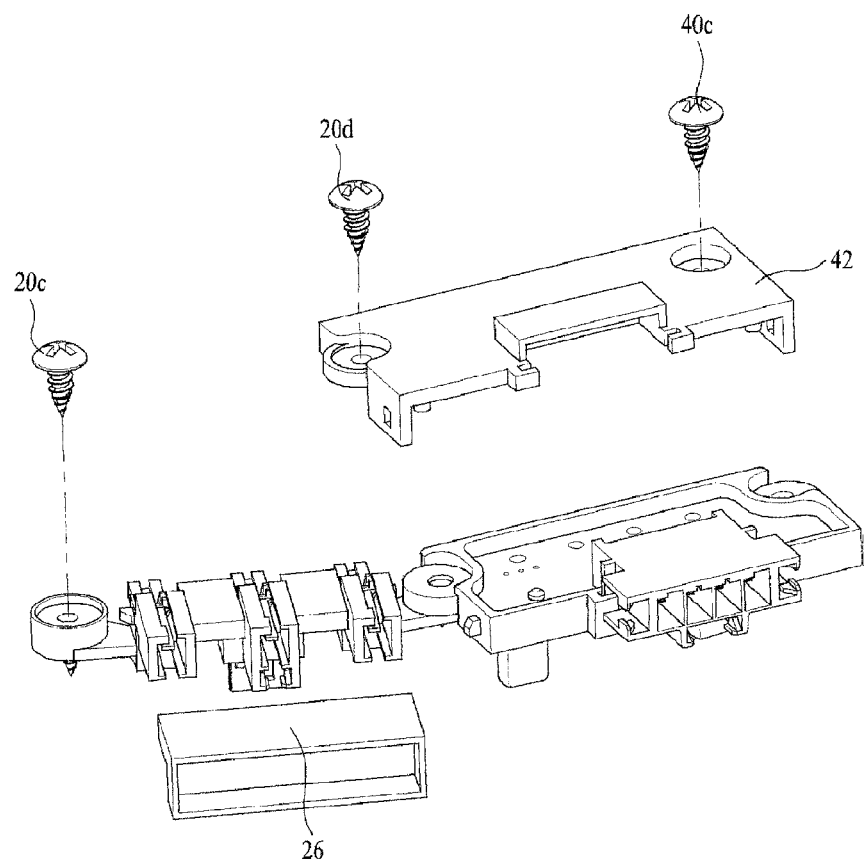
FIG. 3 is an exploded perspective view of FIG. 2.
Figure 4:
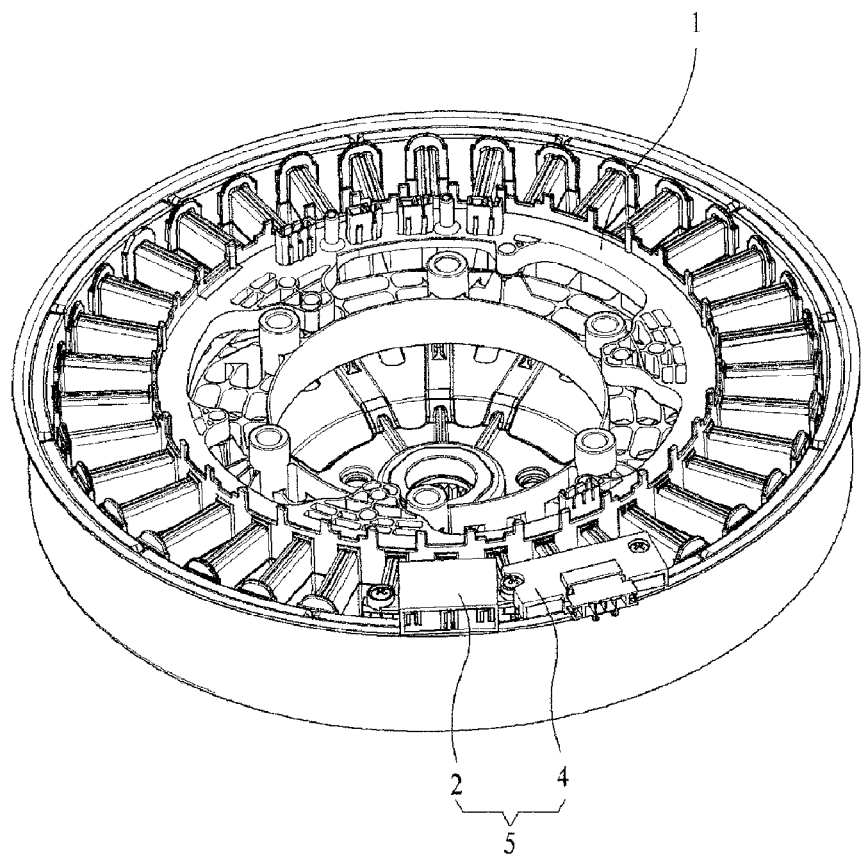
FIG. 4 is a perspective view showing the coupled state of the hall sensor cover of the present invention to an insulator.

FIG. 2 is a perspective view showing a hall sensor cover according to the present invention, FIG. 3 is an exploded perspective view of FIG. 2, and FIG. 4 is a perspective view showing the coupled state of the hall sensor cover of the present invention to an insulator.

As shown in FIG. 2, a hall sensor cover 5 according to the present invention includes a power connector portion 2 and a hall sensor portion 4.

The power connector portion 2 is a portion where coils wound on an insulator surrounding a stator core and external power connectors are connected to each other. The hall sensor portion 4, which includes a hall sensor and a printed circuit board, is a device sending a signal related to a magnetic field measured in the hall sensor to the outside. The hall sensor cover 5 is installed on the end portions of the teeth, which is different from the conventional hall sensor cover fixed to the inner peripheral portion of the insulator.

The power connector portion 2 is coupled to the insulator by means of fastening means 20c and 20d. The fastening means 20c and 20d are fixed to the end portion of the insulator. The power connector portion 2 and the hall sensor portion 4 are connected to each other by means of the fastening means 20d. Fastening means 40c of the hall sensor portion 4 may be fixed to the end portion of the insulator. Like this, the power connector portion 2 and the hall sensor portion 4 are made separately from each other and connected to each other by means of the fastening means 20d. Alternatively, they are formed integrally with each other as a single member, without having any fastening means 20d.

Referring to FIG. 3, the power connector portion 2 is surrounded by a protection cap 26, and the hall sensor portion 4 is covered by a printed circuit board cover 42. The protection cap 26 serves to protect the power connector portion 2 from the external impacts or electrical interferences, and the printed circuit board cover 42 serves to protect the printed circuit board of the hall sensor portion 4 from the external impacts.

Referring to FIG. 4, the hall sensor cover 5 according to the present invention is mounted on the end portion of the teeth of the insulator 1. The conventional hall sensor cover is fixed to the inside of the insulator, and connecting portions with external power connectors are mounted on the end portions of the teeth, so that the size of the hall sensor cover is extended to increase the quantity of resin mold needed. Further, lead wires should be introduced to perform electric connection from the mag-mate terminals of the inside of the insulator to the connecting portions with the external power connectors mounted on the end portions of the teeth, which makes the manufacturing process complicated and increases the manufacturing cost thereof. However, the hall sensor cover 5 according to the present invention solves the above-mentioned problems suffered in the conventional practice.

Figure 5:
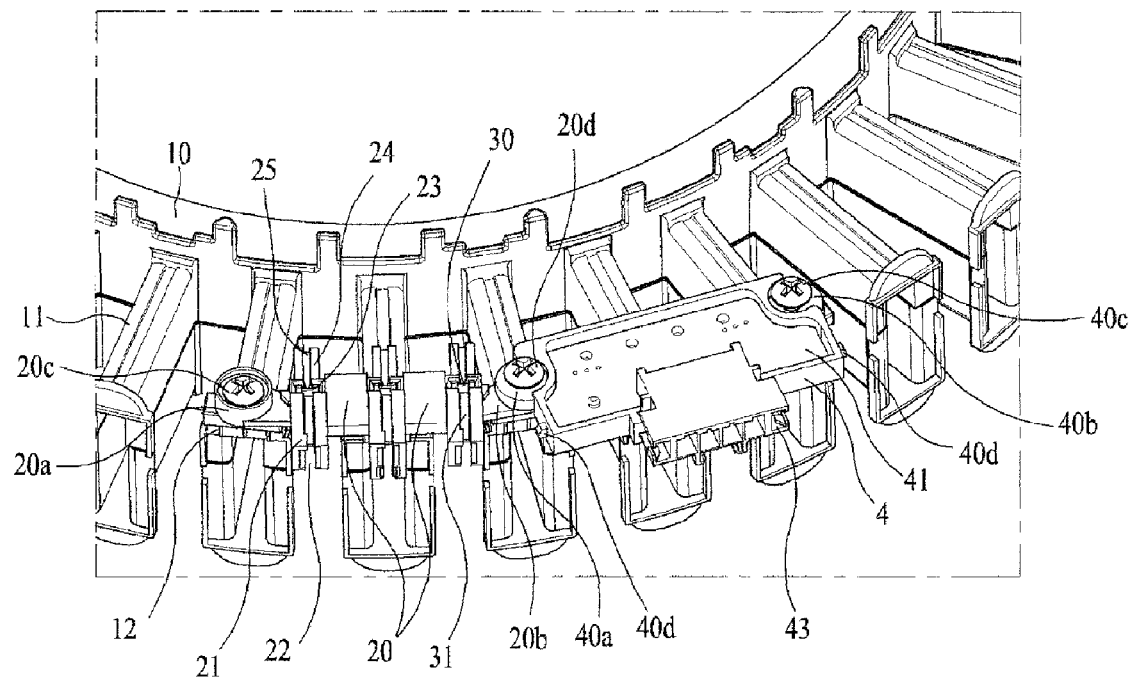
FIG. 5 is an enlarged perspective view showing the coupled state of the hall sensor cover of the present invention to the insulator.
Figure 6:
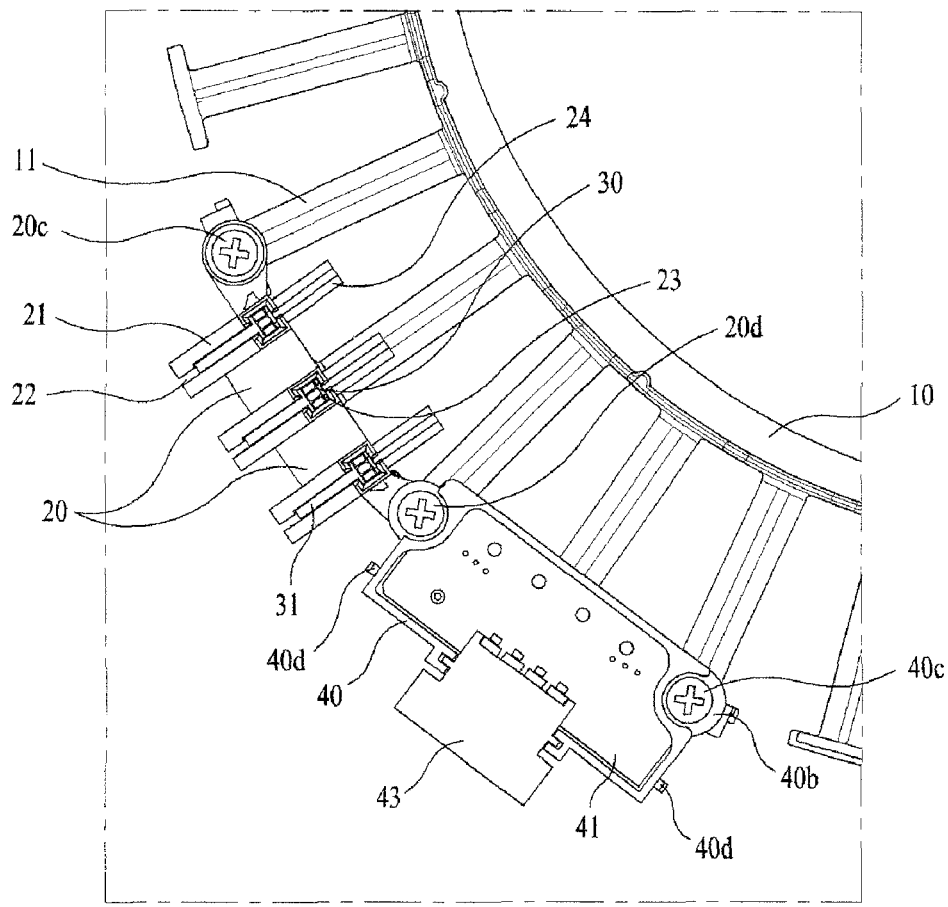
FIG. 6 is a plane view of FIG. 5.

FIG. 5 is an enlarged perspective view showing the coupled state of the hall sensor cover of the present invention to the insulator, and FIG. 6 is a plane view of FIG. 5. In FIGS. 5 and 6, in the state where the protection cap 26 of the power connector portion 2 and the printed circuit board cover 42 of the hall sensor portion 4 are removed from the hall sensor cover 5, the hall sensor cover 5 is coupled to the end portions of the teeth of the insulator 1.

Referring to FIGS. 5 and 6, the power connector portion 2 has a base 20 coupled to the end portions 12 of the teeth 11 of the insulator 1. Fastening portions 20a and 20b are formed on both ends of the base 20. The base 20 is fixed to the end portions 12 of the teeth 11 by fastening the fastening means 20c and 20d on the fastening portions 20a and 20b. In FIG. 5, the screws are adopted as the fastening means 20c and 20d, but they are not necessarily limited thereto. That is, protrusions may be formed on the end portions 12 of the teeth 11 in such a manner as to be inserted into the fastening portions 20a and 20b. Alternatively, the base 20 may be fixed to the end portions 12 of the teeth 11 by means of an adhesive or various coupling ways.

The base 20 has power terminal insertion portions 21 adapted to couple the external power connectors thereto. The number of the power terminal insertion portions 21 is three for connecting three phases U, V, W, but it is not necessarily limited thereto, which is varied in accordance with the kinds, structures and shapes of the motor.

Each power terminal insertion portion 21 has a power terminal insertion slot 22 formed on the front surface thereof to insert the external power connector thereinto and a mag-mate terminal insertion slot 23 formed on the rear surface thereof to insert a mag-mate terminal portion 3 adapted to be electrically connected to a coil. The mag-mate terminal portion 3 has a power terminal pin 31 extended toward the front surface thereof in a shape of a pin.

A coil introduction portion 24 is formed on one side of the mag-mate terminal insertion slot 23 so as to introduce the coil thereinto, and the coil introduction portion 24 has a coil seating slot 25 formed thereon, so that so as to rigidly fix the coil to the coil seating slot 25 when the coil is located thereon, preferably, the coil is forcedly fitted thereinto.

The hall sensor portion 4 includes a hall sensor body 40 and a printed circuit board 41 located inside the hall sensor body 40. The hall sensor portion 4 is made of a resin molding material, and it has a hall sensor (not shown) mounted on the underside portion thereof. Preferably, the hall sensor is located fixedly between the teeth of the insulator.

Fastening portions 40a and 40b are formed on both ends of the hall sensor body 40. The hall sensor body 40 is fixed to the end portions 12 of the teeth 11 by fastening the fastening means 20d and 40c on the fastening portions 40a and 40b. In FIG. 5, the screws are adopted as the fastening means 20d and 40c, but they are not necessarily limited thereto. That is, protrusions may be formed on the end portions 12 of the teeth 11 in such a manner as to be inserted into the fastening portions 40a and 40b. Alternatively, the hall sensor body 40 may be fixed to the end portions 12 of the teeth 11 by means of an adhesive or various coupling ways.

Desirably, the fastening portion 40a of the hall sensor portion 4 is laid on the fastening portion 20b formed on one side of the base 20 of the power connector portion 2, so that the hall sensor portion 4 and the power connector portion 2 are fixed together to the teeth end portion 12 by means of one fastening means 20d.

The hall sensor body 40 has a hall sensor connector 43 coupled to the front surface of the center portion thereof.

The printed circuit board 41 is coupled on the top portion thereof to a separate printed circuit board cover, which will be explained below with reference to FIG. 8.

Figure 7:
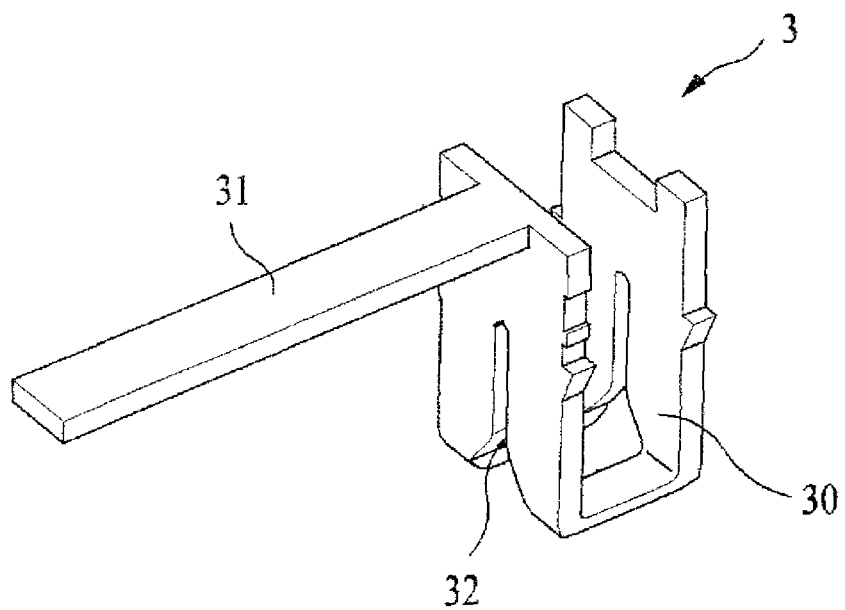
FIG. 7 is a perspective view showing a mag-mate terminal portion adopted in the present invention.

FIG. 7 is a perspective view showing a mag-mate terminal portion adopted in the present invention.

According to the present invention, as shown in FIG. 7, the mag-mate terminal portion 3 largely includes a mag-mate terminal 30 and a power terminal pin 31. The mag-mate terminal 30 is inserted into a mag-mate terminal insertion slot 23 of the power connector portion 2, and the power terminal pin 31 extended from the upper portion of the mag-mate terminal 30 is located inside the power terminal insertion slot 22 of the power connector portion 2. The mag-mate terminal portion 3 has a coil insertion slit 32 formed on the lower portion thereof in such a manner as to be electrically connected to the coil. Accordingly, the coil introduced from the coil introduction portion 24 of the power connector portion 2 is inserted into the coil insertion slit 32 to achieve electrical connection. As a result, the electrical connection between the coil and the external power is conducted by means of the mag-mate terminal portion 3.

Figure 8:
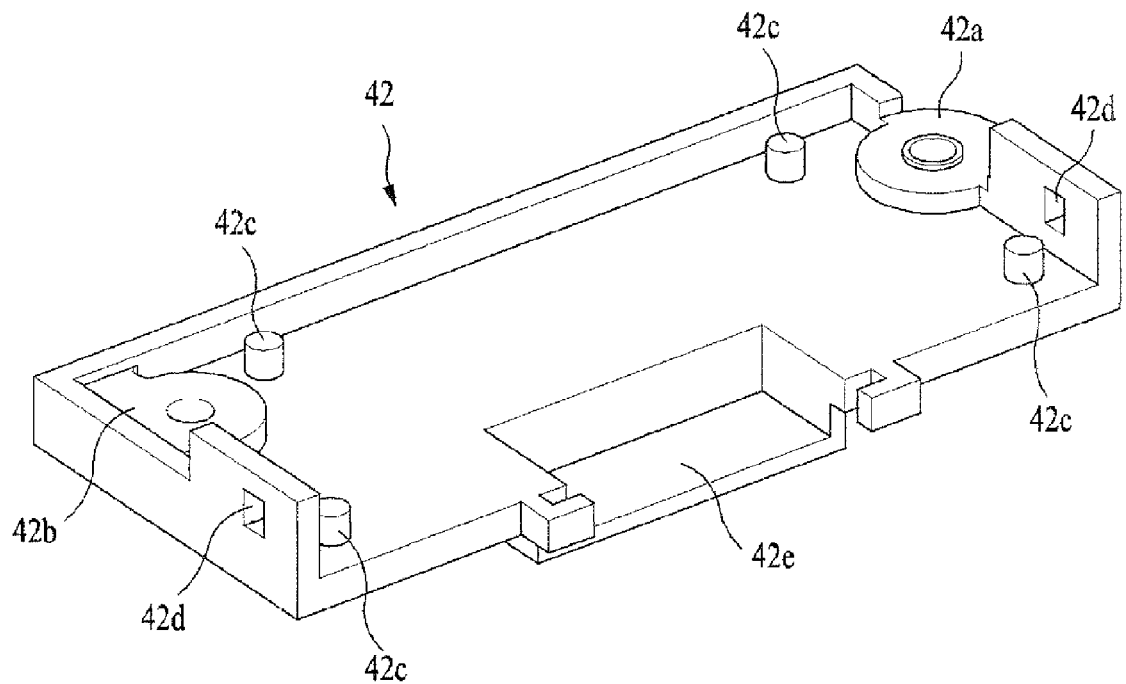
FIG. 8 is a perspective view showing the back surface of a printed circuit board cover adopted in the present invention.

FIG. 8 is a perspective view showing the back surface of a printed circuit board cover adopted in the present invention.

Referring to FIG. 8, the printed circuit board cover 42 adopted in the hall sensor portion 4 according to the present invention is mounted on the top portion of the hall sensor body 40. The coupling of the printed circuit board cover 42 is performed through adhesives, separate screws, and other ways. In FIG. 8, fastening means are coupled to the fastening portions 42a and 42b formed on both sides of the printed circuit board cover 42.

The printed circuit board cover 42 has at least one or more fixing protrusions 42c formed on the inside thereof, and the fixing protrusions 42c are adapted to lightly press the top portion of the printed circuit board 41 to fix the printed circuit board 41, without any movement.

The printed circuit board cover 42 has locking grooves 42d formed on both sides thereof, and the locking grooves 42d are coupled to locking protrusions 40d formed on both sides of the hall sensor body 40 to allow the printed circuit board cover 42 to be rigidly coupled to the hall sensor body 40. Further, the printed circuit board cover 42 has a hall sensor connector seating portion 42e formed on the front surface of the center portion thereof to seat the hall sensor connector 43 thereon.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The invention claimed is:

1. A hall sensor cover comprising: mag-mate terminal portions each having a mag-mate terminal having a coil insertion slit formed thereon and a power terminal pin extended toward one side direction of the mag-mate terminal; and a power connector portion having a base having mag-mate terminal insertion slots formed to insert the mag-mate terminal portions thereinto and power terminal insertion portions each adapted to insert the power terminal pin thereinto, wherein the power connector portion is coupled to the end portions of teeth of an insulator.

2. The hall sensor cover according to claim 1, further comprising a hall sensor portion having a hall sensor body coupled to one side of the power connector portion, a printed circuit board located inside the hall sensor body, and a printed circuit board cover coupled to the top portion of the hall sensor body, the hall sensor body being coupled to the end portions of the teeth of the insulator.

3. The hall sensor cover according to claim 2, wherein the printed circuit board cover comprises at least one or more fixing protrusions formed on the inside thereof.

4. The hall sensor cover according to claim 1, further comprising coil introduction portions extended to the rear surfaces of the mag-mate terminal insertion slots in such a manner as to allow coils to be introduced into the coil insertion slits of the mag-mate terminals.

5. A motor comprising:
a stator core;
an insulator adapted to surround the stator core and having teeth protruded radially therefrom; and
a hall sensor cover coupled to the end portions of the teeth of the insulator,
wherein the hall sensor cover including:
mag-mate terminal portions each having a mag-mate terminal having a coil insertion slit formed thereon and a power terminal pin extended toward one side direction of the mag-mate terminal; and
a power connector portion having a base having mag-mate terminal insertion slots formed to insert the mag-mate terminal portions thereinto and power terminal insertion portions each adapted to insert the power terminal pin thereinto, wherein the power connector portion is coupled to the end portions of teeth of an insulator.

6. The motor of claim 5, wherein the hall sensor cover further includes a hall sensor portion having a hall sensor body coupled to one side of the power connector portion, a printed circuit board located inside the hall sensor body, and a printed circuit board cover coupled to the top portion of the hall sensor body, the hall sensor body being coupled to the end portions of the teeth of the insulator.

7. The motor of claim 6, wherein the printed circuit board cover comprises at least one or more fixing protrusions formed on the inside thereof.

8. The motor of claim 5, wherein the hall sensor cover further includes coil introduction portions extended to the rear surfaces of the mag-mate terminal insertion slots in such a manner as to allow coils to be introduced into the coil insertion slits of the mag-mate terminals.

\* \* \* \* \*